(12) United States Patent
Zhou et al.

(10) Patent No.: US 10,962,574 B2
(45) Date of Patent: Mar. 30, 2021

(54) CURRENT SENSE APPARATUS AND METHOD

(71) Applicant: NuVolta Technologies (Hefei) Co., Ltd., Hefei (CN)

(72) Inventors: Caiqiang Zhou, Shanghai (CN); Sichao Liu, Shanghai (CN)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 0 days.

(21) Appl. No.: 16/442,676

(22) Filed: Jun. 17, 2019

(65) Prior Publication Data

US 2020/0379018 A1     Dec. 3, 2020

(30) Foreign Application Priority Data

May 30, 2019   (CN) .......................... 201910463720.4

(51) Int. Cl.
| | |
|---|---|
| *H01F 27/42* | (2006.01) |
| *H01F 37/00* | (2006.01) |
| *H01F 38/00* | (2006.01) |
| *G01R 19/00* | (2006.01) |
| *H02J 50/10* | (2016.01) |
| *H03F 3/45* | (2006.01) |
| *H03H 7/06* | (2006.01) |
| *H02J 7/02* | (2016.01) |

(52) U.S. Cl.
CPC ............ *G01R 19/003* (2013.01); *H02J 50/10* (2016.02); *H03F 3/45475* (2013.01); *H03H 7/06* (2013.01); *H02J 7/025* (2013.01); *H03F 2200/165* (2013.01)

(58) Field of Classification Search
CPC ............ G01R 19/22; G06G 7/25; H03D 1/18; H02M 7/217; H02M 7/2173
USPC ......................................................... 307/104
See application file for complete search history.

(56) References Cited

U.S. PATENT DOCUMENTS

| | | | | |
|---|---|---|---|---|
| 5,418,498 A | * | 5/1995 | DeVito | ................ H03K 3/0231 327/538 |
| 8,710,810 B1 | * | 4/2014 | McJimsey | ............. H02M 3/157 323/272 |
| 2015/0137611 A1 | * | 5/2015 | Huang | ................ H02J 7/00712 307/104 |
| 2015/0229213 A1 | * | 8/2015 | Syngaevskiy | ......... H02M 3/155 323/271 |
| 2017/0063118 A1 | * | 3/2017 | Kohout | ................ H02J 7/0071 |

* cited by examiner

*Primary Examiner* — Quan Tra
(74) *Attorney, Agent, or Firm* — Slater Matsil, LLP (57) ABSTRACT

An apparatus includes a power switch configured to conduct a dc or ac current, a sense switch having a first drain/source terminal and a gate connected to a first drain/source terminal and a gate of the power switch respectively, an amplifier having a first input coupled to a second drain/source terminal of the power switch and a second input coupled to a second drain/source terminal of the sense switch and a first current sense processing switch having a gate connected to an output of the amplifier.

18 Claims, 7 Drawing Sheets

CURRENT SENSE APPARATUS AND METHOD

PRIORITY CLAIM

This application claims priority to Chinese Patent Application No. 201910463720.4, filed on May 30, 2019, which is hereby incorporated by reference in its entirety.

TECHNICAL FIELD

The present invention relates to a current sense apparatus, and, in particular embodiments, to a high efficiency current sense apparatus in a wireless charging system.

BACKGROUND

As technologies further advance, wireless power transfer has emerged as an efficient and convenient mechanism for powering or charging battery based mobile devices such as mobile phones, tablet PCs, digital cameras, MP3 players and/or the like. A wireless power transfer system typically comprises a primary side transmitter and a secondary side receiver. The primary side transmitter is magnetically coupled to the secondary side receiver through a magnetic coupling. The magnetic coupling may be implemented as a loosely coupled transformer having a primary side coil formed in the primary side transmitter and a secondary side coil formed in the secondary side receiver.

The primary side transmitter may comprise a power conversion unit such as a primary side of a power converter. The power conversion unit is coupled to a power source and is capable of converting electrical power to wireless power signals. The secondary side receiver is able to receive the wireless power signals through the loosely coupled transformer and convert the received wireless power signals to electrical power suitable for a load.

As power consumption has become more important, there may be a need for accurately monitoring the current flowing through the transmitter and/or receiver of the wireless power transfer system so as to achieve a high-efficiency, safe and reliable wireless power transfer between the transmitter and the receiver. Current sense devices such as current sense resistors have become the preferred choice for achieving high performance (e.g., accurate current measurement information) because current sense resistors can be connected in series with one power switch of the transmitter and/or receiver. However, as the current flowing through the power switch of the transmitter/receiver goes higher, the power loss of the current sense resistors has become a significant issue, which presents challenges to designers of wireless power transfer systems.

It would be desirable to have a current sense apparatus for use in high power wireless power transfer applications exhibiting good behaviors such as highly-accurate current sensing and low power consumption.

SUMMARY

These and other problems are generally solved or circumvented, and technical advantages are generally achieved, by preferred embodiments of the present disclosure which provide a high efficiency current sense apparatus in a wireless power transfer system.

In accordance with an embodiment, an apparatus comprises a power switch configured to conduct a dc or ac current, a sense switch having a first drain/source terminal and a gate connected to a first drain/source terminal and a gate of the power switch respectively, an amplifier having a first input coupled to a second drain/source terminal of the power switch and a second input coupled to a second drain/source terminal of the sense switch and a first current sense processing switch having a gate connected to an output of the amplifier.

In accordance with another embodiment, a method comprises configuring a receiver to operate as a transmitter, wherein the receiver comprises a power switch configured to be fully turned on and mirroring in a current sense processing circuit a current passing through the power switch, wherein the current sense processing circuit comprises a sense switch having a first drain/source terminal and a gate connected to a first drain/source terminal and a gate of the power switch respectively and an amplifier having a first input coupled to a second drain/source terminal of the power switch and a second input coupled to a second drain/source terminal of the sense switch.

In accordance with yet another embodiment, a system comprises a power switch coupled to a coil through a rectifier and a current sense apparatus having two inputs connected to a first drain/source terminal and a second drain/source terminal of the power switch respectively, wherein the current sense apparatus comprises a sense switch having a first drain/source terminal and a gate connected to the first drain/source terminal and a gate of the power switch respectively, an amplifier having a first input coupled to the second drain/source terminal of the power switch and a second input coupled to a second drain/source terminal of the sense switch and a first current sense processing switch having a gate connected to an output of the amplifier.

An advantage of an embodiment of the present disclosure is a high efficiency current sense apparatus in a wireless power transfer system having highly-accurate current sensing and low power consumption.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a current sense apparatus for a wireless power transfer system. The disclosure may also be applied, however, to a variety of power systems. Hereinafter, various embodiments will be explained in detail with reference to the accompanying drawings.

Figure 1:
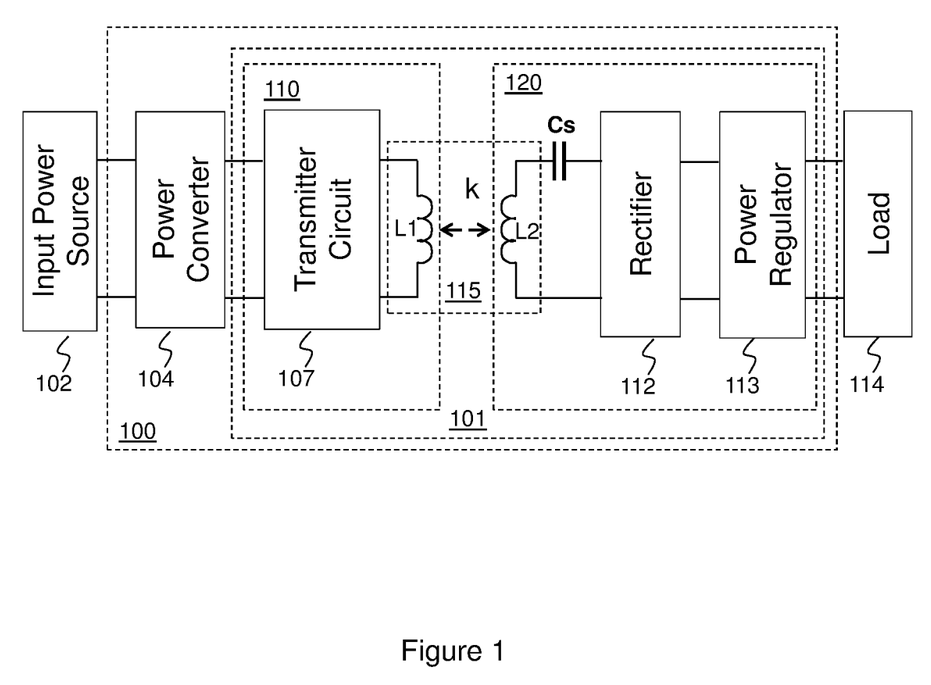
FIG. 1 illustrates a block diagram of a wireless power transfer system in accordance with various embodiments of the present disclosure.

FIG. 1 illustrates a block diagram of a wireless power transfer system in accordance with various embodiments of the present disclosure. The wireless power transfer system 100 comprises a power converter 104 and a wireless power transfer device 101 connected in cascade between an input power source 102 and a load 114. In some embodiments, the power converter 104 is employed to further improve the performance of the wireless power transfer system 100. In alternative embodiments, the power converter 104 is an optional element. In other words, the wireless power transfer device 101 may be connected to the input power source 102 directly.

The wireless power transfer device 101 includes a power transmitter 110 and a power receiver 120. As shown in FIG. 1, the power transmitter 110 comprises a transmitter circuit 107 and a transmitter coil L1 connected in cascade. The input of the transmitter circuit 107 is coupled to an output of the power converter 104. The power receiver 120 comprises a receiver coil L2, a resonant capacitor Cs, a rectifier 112 and a power regulator 113 connected in cascade. As shown in FIG. 1, the resonant capacitor Cs is connected in series with the receiver coil L2 and further connected to the inputs of the rectifier 112. The outputs of the rectifier 112 are connected to the inputs of the power regulator 113. The outputs of the power regulator 113 are coupled to the load 114.

The power transmitter 110 is magnetically coupled to the power receiver 120 through a magnetic field when the power receiver 120 is placed near the power transmitter 110. A loosely coupled transformer 115 is formed by the transmitter coil L1, which is part of the power transmitter 110, and the receiver coil L2, which is part of the power receiver 120. As a result, electrical power may be transferred from the power transmitter 110 to the power receiver 120.

In some embodiments, the power transmitter 110 may be inside a charging pad. The transmitter coil L1 is placed underneath the top surface of the charging pad. The power receiver 120 may be embedded in a mobile phone. When the mobile phone is placed near the charging pad, a magnetic coupling may be established between the transmitter coil L1 and the receiver coil L2. In other words, the transmitter coil L1 and the receiver coil L2 may form a loosely coupled transformer through which a power transfer occurs between the power transmitter 110 and the power receiver 120. The strength of coupling between the transmitter coil L1 and the receiver coil L2 is quantified by the coupling coefficient k. In some embodiments, k is in a range from about 0.05 to about 0.9.

In some embodiments, after the magnetic coupling has been established between the transmitter coil L1 and the receiver coil L2, the power transmitter 110 and the power receiver 120 may form a power system through which power is wirelessly transferred from the input power source 102 to the load 114.

The input power source 102 may be a power adapter converting a utility line voltage to a direct-current (dc) voltage. Alternatively, the input power source 102 may be a renewable power source such as a solar panel array. Furthermore, the input power source 102 may be any suitable energy storage devices such as rechargeable batteries, fuel cells, any combinations thereof and/or the like.

The load 114 represents the power consumed by the mobile device (e.g., a mobile phone) coupled to the power receiver 120. Alternatively, the load 114 may refer to a rechargeable battery and/or batteries connected in series/parallel, and coupled to the output of the power receiver 120. Furthermore, the load 114 may be a downstream power converter such as a battery charger.

The transmitter circuit 107 may comprise primary side switches of a full-bridge converter according to some embodiments. Alternatively, the transmitter circuit 107 may comprise the primary side switches of any other suitable power converters such as a half-bridge converter, a push-pull converter, any combinations thereof and/or the like.

It should be noted that the power converters described above are merely examples. One having ordinary skill in the art will recognize other suitable power converters such as class E topology based power converters (e.g., a class E amplifier), may alternatively be used depending on design needs and different applications.

The transmitter circuit 107 may further comprise a resonant capacitor (not shown). The resonant capacitor and the magnetic inductance of the transmitter coil may form a resonant tank. Depending on design needs and different applications, the resonant tank may further include a resonant inductor. In some embodiments, the resonant inductor may be implemented as an external inductor. In alternative embodiments, the resonant inductor may be implemented as a connection wire.

The power receiver 120 comprises the receiver coil L2 magnetically coupled to the transmitter coil L1 after the power receiver 120 is placed near the power transmitter 110. As a result, power may be transferred to the receiver coil and further delivered to the load 114 through the rectifier 112. The power receiver 120 may comprise a secondary resonant capacitor Cs as shown in FIG. 1. Throughout the description, the secondary resonant capacitor Cs may be alternatively referred to as a receiver resonant capacitor.

The rectifier 112 converts an alternating polarity waveform received from the resonant tank comprising the receiver coil L2 and the receiver resonant capacitor Cs to a single polarity waveform. In some embodiments, the rectifier 112 comprises a full-wave diode bridge and an output capacitor. In alternative embodiments, the full-wave diode bridge may be replaced by a full-wave bridge formed by switching elements such as n-type metal oxide semiconductor (NMOS) transistors.

Furthermore, the rectifier 112 may be formed by other types of controllable devices such as metal oxide semiconductor field effect transistor (MOSFET) devices, bipolar junction transistor (BJT) devices, super junction transistor (SJT) devices, insulated gate bipolar transistor (IGBT) devices, gallium nitride (GaN) based power devices and/or the like. The detailed operation and structure of the rectifier 112 are well known in the art, and hence are not discussed herein.

The power regulator 113 is coupled between the rectifier 112 and the load 114. The power regulator 113 is a non-isolated power regulator. In some embodiments, the power regulator 113 is implemented as a linear regulator. The linear regulator may be implemented as a p-type MOSFET or an n-type MOSFET. In alternative embodiments, the power regulator 113 may be implemented as any suitable step-down power regulators such as a buck converter. Depending on different applications and design needs, the power regulator 113 may be implemented as a four-switch buck-boost power converter.

Furthermore, the power regulator 113 may be implemented as a hybrid power converter. The hybrid converter is a non-isolated power converter comprising four switches, an inductor and an output capacitor. The inductor and the output capacitor form an output filter. The first switch, the capacitor and a third switch are connected in series between an input of the hybrid converter and the output filter. A second switch is connected between a common node of the first switch and the capacitor, and a common node of the third switch and the output filter. A fourth switch is connected between a common node of the third switch and the capacitor, and ground. By controlling the on/off of the switches of the hybrid converter, the hybrid converter can be configured as a buck converter, a charge pump converter or a hybrid converter.

Depending design needs and different applications, the hybrid converter may operate in different operating modes. More particularly, the hybrid converter may operate in a buck mode when the load current is less than a predetermined current threshold and/or the input voltage is less than a predetermined voltage threshold. In the buck mode, the hybrid converter is configured as a buck converter. The hybrid converter may operate in a charge pump mode or a hybrid mode when the input voltage is greater than the predetermined voltage threshold and/or the load current is greater than the predetermined current threshold. More particularly, in some embodiments, the hybrid converter may operate in a charge pump mode or a hybrid mode when a ratio of the output voltage of the hybrid converter to the input voltage of the hybrid converter is less than 0.5. In the charge pump mode, the hybrid converter is configured as a charge pump converter. In the hybrid mode, the hybrid converter is configured as a hybrid converter.

Figure 2:
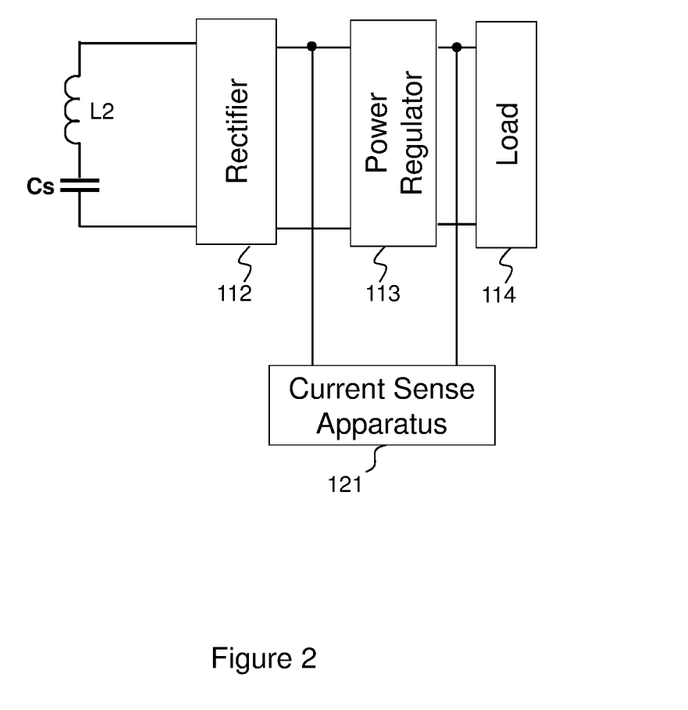
FIG. 2 illustrates a block diagram of the receiver shown in FIG. 1 in accordance with various embodiments of the present disclosure.

FIG. 2 illustrates a block diagram of the receiver shown in FIG. 1 in accordance with various embodiments of the present disclosure. As shown in FIG. 2, the receiver coil L2 and the receiver resonant capacitor Cs are connected in series. The receiver coil L2 is configured to be magnetically coupled to a transmitter coil (not shown). The receiver resonant capacitor Cs and the receiver coil L2 form a receiver resonant tank.

The two inputs of the rectifier 112 are connected to the receiver coil L2 and the receiver resonant capacitor Cs respectively. The outputs of the rectifier 112 are connected to the inputs of the power regulator 113. The outputs of the power regulator 113 are connected to the load 114.

As shown in FIG. 2, a current sense apparatus 121 is connected between an input of the power regulator 113 and an output of the power regulator 113. The detailed schematic diagram of the current sense apparatus 121 will be described below with respect to FIG. 3.

In some embodiments, the receiver is configured to operate as a transmitter. The load 114 is a battery, which functions as a power source. The battery provides power to coils magnetically coupled to the coil L2. When the receiver shown in FIG. 2 operates as a transmitter and the power regulator is implemented as a linear regulator, the power regulator 113 is configured to be a fully turned-on power switch. Throughout the description, the power regulator 113 may be alternatively referred to as a power switch. The rectifier 112 is configured to be a full-bridge converter. Throughout the description, the rectifier 112 may be alternatively referred to as a full-bridge converter.

It should be noted that the full-bridge converter 112 described above is merely an example. One having ordinary skill in the art will recognize that other suitable power converters such as half-bridge converters, push-pull converters, class E topology based power converters (e.g., a class E amplifier), may alternatively be used.

The fully turned on power switch (power regulator 113) may be implemented as a power transistor such as a p-type power transistor or an n-type power transistor. A first terminal of the current sense apparatus 121 is connected to a first drain/source terminal of this power transistor. A second terminal of the current sense apparatus 121 is connected to a second drain/source terminal of this power transistor.

In some embodiments, the power switch 113 may be implemented as an n-type metal oxide semiconductor (NMOS) transistor. Alternatively, the power switch 113 may be implemented as other types of controllable devices such as p-type metal oxide semiconductor field effect transistor (MOSFET) devices, bipolar junction transistor (BJT) devices, super junction transistor (SJT) devices, insulated gate bipolar transistor (IGBT) devices, gallium nitride (GaN) based power devices and/or the like.

Figure 3:
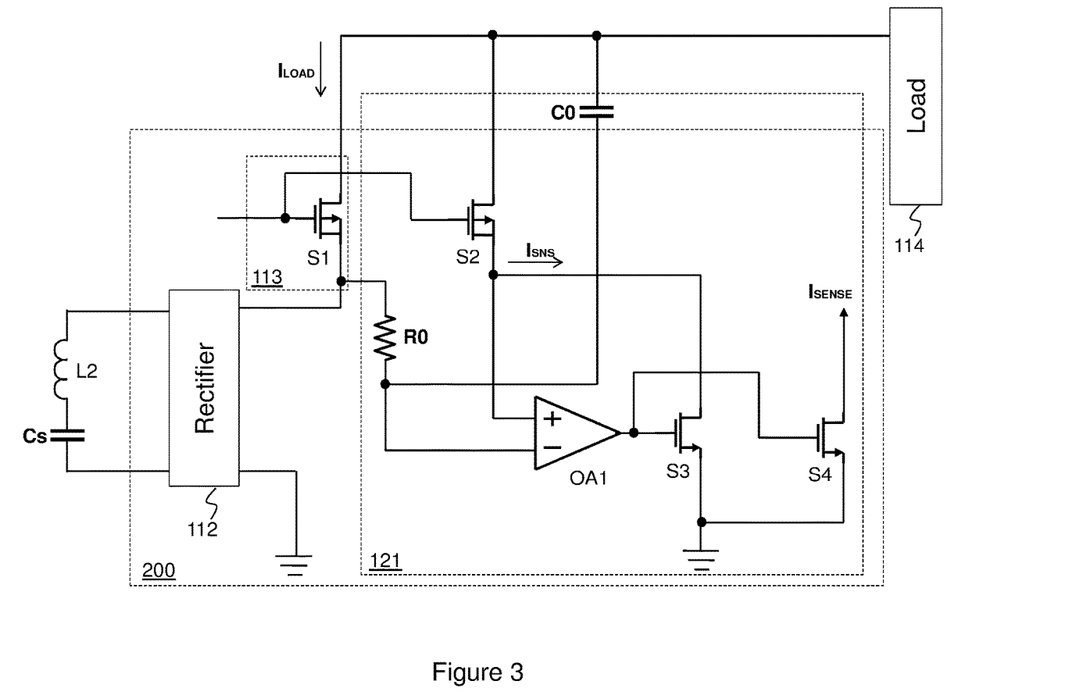
FIG. 3 illustrates a schematic diagram of a first implementation of the current sense apparatus shown in FIG. 2 in accordance with various embodiments of the present disclosure.

FIG. 3 illustrates a schematic diagram of a first implementation of the current sense apparatus shown in FIG. 2 in accordance with various embodiments of the present disclosure. The receiver comprises a rectifier 112, a power regulator 113 and a current sense apparatus 121. The rectifier 112 is a full-wave rectifier comprising four switching elements.

In some embodiments, the power regulator 113 is implemented as a linear regulator comprising a power switch S1 as shown in FIG. 3. In alternative embodiments, the power regulator 113 is implemented as a step down converter (e.g., a buck converter and a hybrid converter). The high-side switch of the buck converter is fully turned on when the receiver is configured to be a transmitter. The high-side switch of the buck converter is considered as the power switch, and the current sense apparatus is connected to the drain and source of the high-side switch to detect the current flowing through the high-side switch. Likewise, the hybrid converter may operate in the buck mode and have the high-side switch (the first switch described above with respect to FIG. 1) always on. As such, a direct conductive path is provided between the load 114 and the rectifier 112. The high-side switch of the hybrid converter in the buck mode is considered as the power switch, and the current sense apparatus is connected to the drain and source of the high-side switch to detect the current flowing through the high-side switch.

The load 114 is a battery. In some embodiments, the battery 114 functions as a power source configured to provide power to a plurality of coils magnetically coupled to the coil L2. As shown in FIG. 3, when the power is provided from the battery 114 to the plurality of coils magnetically coupled to the coil L2, a dc current flows from the battery 114 to the coil L2 through the power switch S1 and the rectifier 112. The power switch S1 is fully turned on. The rectifier 112 functions as a full-bridge converter. The operation principle of the full-bridge converter is well known, and hence is not discussed herein to avoid repetition.

The current sense apparatus 121 comprises a sense switch S2, an amplifier OA1, a first current sense processing switch S3, a second current sense processing switch S4 and a filter. The filter is formed by resistor R0 and capacitor C0. In some embodiments, the filter is a low-pass filter.

As shown in FIG. 3, the power switch S1 has a gate connected to the gate of the sense switch S2. The drain of the power switch S1 is connected to the drain of the sense switch S2 and further connected to the load 114. The source of the power switch S1 is connected to an inverting input of the operational amplifier OA1 through resistor R0. The source of the sense switch S2 is connected to a non-inverting input of the operational amplifier OA1.

The gate of the first current sense processing switch S3 and the gate of the second current sense processing switch S4 are connected together and further connected to the output of the operational amplifier OA1. The drain of the first current sense processing switch S3 is connected to the non-inverting input of the operational amplifier OA1. The source of the first current sense processing switch S3 is connected to ground. The drain of the second current sense processing switch S4 is employed to generate the sensed current $I_{SENSE}$. The source of the second current sense processing switch S4 is connected to ground.

The operational amplifier OA1 drives the voltage difference across its two inputs equal to zero or almost equal to zero. More particularly, when uneven voltages at the two inputs of the operational amplifier OA1 occur, the operational amplifier OA1 may adjust the voltage across the sense switch S2 by adjusting the voltage at the gate of the first current sense processing switch S3. As a result, the voltage across the sense switch S2 is forced to be equal to that of the voltage across the power switch S1.

Since the drain-to-source voltage of the power switch S1 is equal to the drain-to-source voltage of the sense switch S2, and the gate of the power switch S1 is connected to the gate of the sense switch S2, the power switch S1 and the sense switch S2 form a current mirror. According to the operating principles of current mirrors, the current flowing through the sense switch S2 is proportional to the current flowing through the power switch S1.

In some embodiments, the current mirror formed by the power switch S1 and the sense switch S2 is used to scale down the current flowing through the power switch S1 to a lower level so that the power loss at the sensing device can be reduced accordingly. In some embodiments, the power switch S1 may comprise M transistor cells connected in parallel. The sense switch S2 may comprise m transistor cells connected in parallel. The current mirror may scale down the current flowing through the power switch S1 by a ratio of M to m. In some embodiments, M is equal 10,000 and m is equal to 1. It should be noted that the ratio of 10,000 to 1 is merely an example. This ratio is selected purely for demonstration purposes and is not intended to limit the various embodiments of the present disclosure.

In alternative embodiments, the power switch S1 may be an NMOS transistor having a channel width equal to M. The sense switch S2 is an NMOS transistor having a channel width equal to m. It is well known that when two transistors have the same drain, source and gate voltages, the current flowing through each transistor is proportional to its channel width. As shown in FIG. 3, the drains, sources and gates of the power switch S1 and the sense switch S2 are at the same voltage potentials. As a result, the current mirror formed by the power switch S1 and the sense switch S2 has a ratio of M to m.

The first current sense processing switch S3 and the second current sense processing switch S4 also form a current mirror. The current flowing through the first current sense processing switch S3 is proportional to the current flowing through the second current sense processing switch S4. The current level of $I_{SENSE}$ may be determined by selecting the ratio of the current mirror formed by S3 and S4. In some embodiments, the ratio of this current mirror is set to 1. It should be noted that the ratio of the second current mirror is selected purely for demonstration purposes and is not intended to limit the various embodiments of the present disclosure.

One advantageous feature of having the current sense apparatus 121 is that the sense switch (e.g., S2) help to improve the current sense accuracy and reduce unnecessary power losses.

The drain-to-source on-resistance of the power switch S1 is defined as $R_{POWER}$. The drain-to-source on-resistance of the sense switch S2 is defined as $R_{SNS}$. As shown in FIG. 3, the current flowing through the power switch S1 is defined as $I_{LOAD}$. The current flowing into the sense switch S2 is defined as $I_{SNS}$. The current flowing through the power switch S1 and the current flowing into the sense switch S2 satisfy the following equation: $I_{SNS}/I_{LOAD}=R_{POWER}/R_{SNS}$.

The equation above indicates the sensed current flowing through the sense switch S2 is equal to the load current times a ratio of the drain-to-source on-resistance of the power switch S1 to the drain-to-source on-resistance of the sense switch S2. In some embodiments, the ratio of the drain-to-source on-resistance of the power switch S1 to the drain-to-source on-resistance of the sense switch S2 is about 1:10,000. The current flowing through the first current sense processing switch S3 is equal to the current flowing through the sense switch S2. As described above, the ratio of the current mirror formed by S3 and S4 is equal to 1. As a result, $I_{SENSE}$ is equal to $I_{SNS}$.

The filter comprises resistor R0 and capacitor C0 as shown in FIG. 3. The filter is employed to attenuate the switching ripple so as to generate an average sense current $I_{SENSE}$. In some embodiments, the frequency of the communication signals of the wireless power transfer system is in a range from about 1 KHz to about 2 KHz. The switching frequency of the full-bridge converter 112 is about 100 KHz.

The resistor and the capacitor are selected such that the cutoff frequency of the filter is in a range from about 2 KHz to about 100 KHz.

FIG. 3 shows the rectifier 112, the power switch S1, the sense switch S2, resistor R0, operation amplifier OA1, the first sense processing switch S3 and the second sense processing switch S4 are within a dashed box 200. In some embodiments, the devices in the dashed box 200 may be fabricated on a single semiconductor die. In alternative embodiments, the devices in the dashed box 200 may be fabricated on a single lead frame and packaged in a same semiconductor chip.

Figure 4:
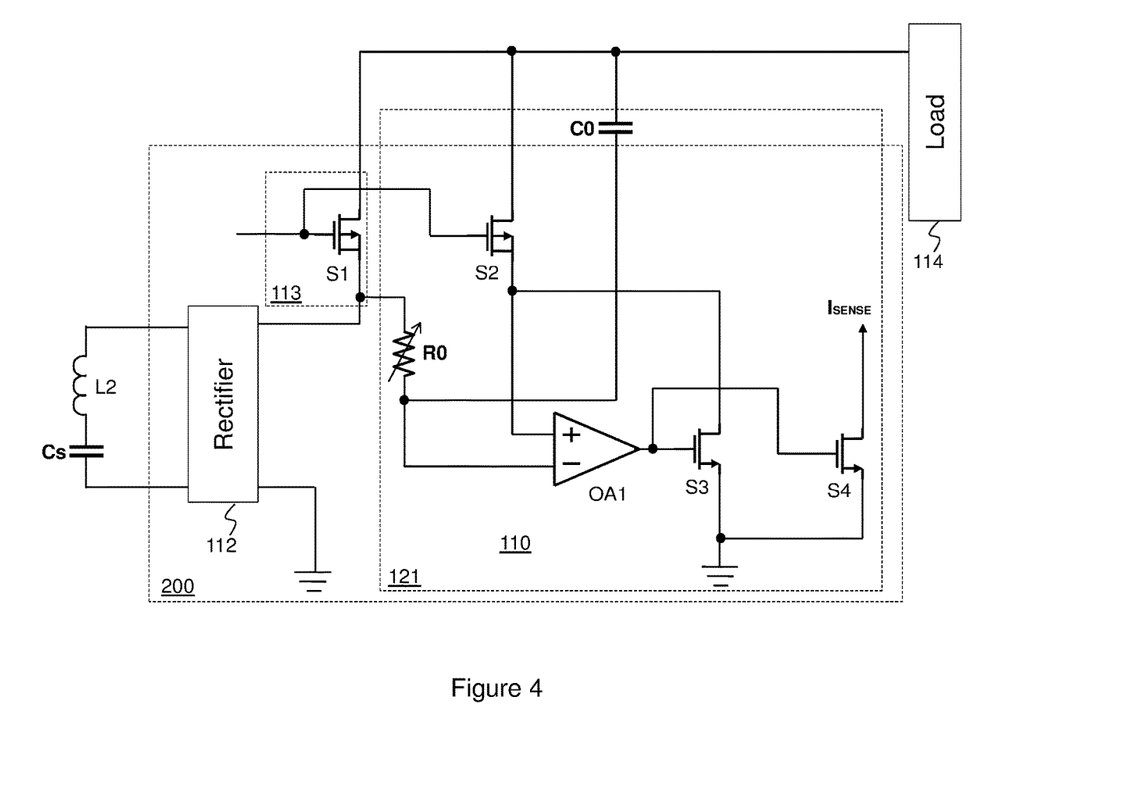
FIG. 4 illustrates a schematic diagram of a second implementation of the current sense apparatus shown in FIG. 2 in accordance with various embodiments of the present disclosure.

FIG. 4 illustrates a schematic diagram of a second implementation of the current sense apparatus shown in FIG. 2 in accordance with various embodiments of the present disclosure. The current sense apparatus 121 shown in FIG. 4 is similar to the current sense apparatus shown in FIG. 3 except that resistor R0 is replaced by an adjustable resistor. By employing an adjustable resistor, the cutoff frequency of the filter is adjustable by adjusting the adjustable resistor. In some embodiments, the adjustable resistor shown in FIG. 4 may be implemented as a plurality of resistor-switch networks connected in parallel. In operation, by selecting the on/off the switches, the cutoff frequency of the filter can be adjusted accordingly.

In operation, the wireless power transfer system may lower its switching frequency under some operation conditions. For example, the switching frequency of the full-bridge converter 112 may be reduced to a lower frequency when the wireless power transfer system operates in a heavy load mode. In response to the reduced switching frequency, the cutoff frequency of the filter may be adjusted accordingly to better attenuate the switching ripple, thereby achieving an accurate current sense value.

Figure 5:
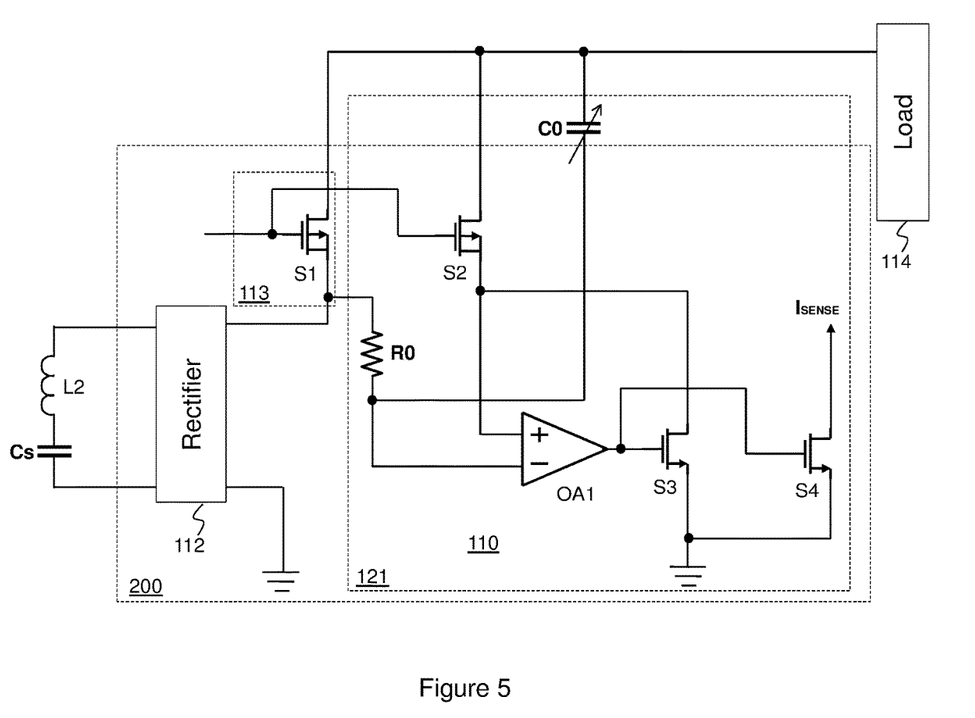
FIG. 5 illustrates a schematic diagram of a third implementation of the current sense apparatus shown in FIG. 2 in accordance with various embodiments of the present disclosure.

FIG. 5 illustrates a schematic diagram of a third implementation of the current sense apparatus shown in FIG. 2 in accordance with various embodiments of the present disclosure. The current sense apparatus 121 shown in FIG. 5 is similar to the current sense apparatus shown in FIG. 3 except that capacitor C0 is replaced by an adjustable capacitor. By employing an adjustable capacitor, the cutoff frequency of the filter is adjustable by adjusting the adjustable capacitor. In some embodiments, the adjustable capacitor shown in FIG. 5 may be implemented as a plurality of capacitor-switch networks connected in parallel. In operation, by selecting the on/off the switches, the cutoff frequency of the filter can be adjusted accordingly.

In operation, the wireless power transfer system may lower its switching frequency under some operation conditions. For example, the switching frequency of the full-bridge converter 112 may be reduced to a lower frequency when the wireless power transfer system operates in a heavy load mode. In response to the reduced switching frequency, the cutoff frequency of the filter may be adjusted accordingly to better attenuate the switching ripple, thereby achieving an accurate current sense value.

Figure 6:
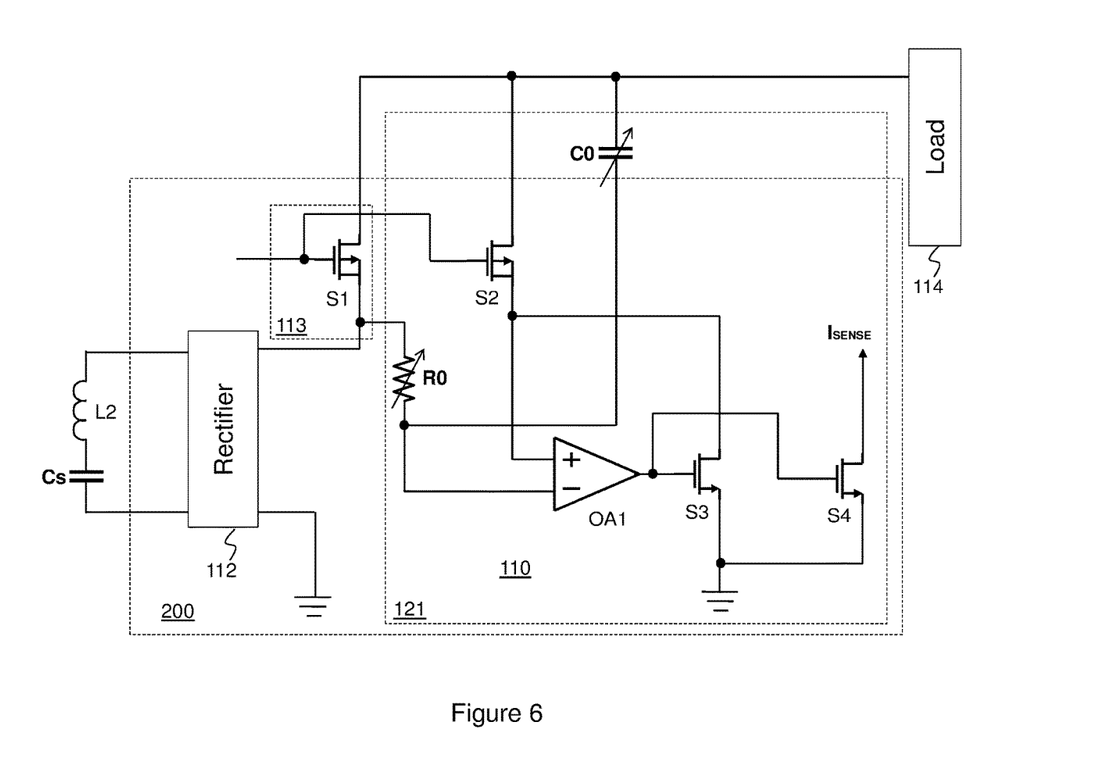
FIG. 6 illustrates a schematic diagram of a fourth implementation of the current sense apparatus shown in FIG. 2 in accordance with various embodiments of the present disclosure.

FIG. 6 illustrates a schematic diagram of a fourth implementation of the current sense apparatus shown in FIG. 2 in accordance with various embodiments of the present disclosure. The current sense apparatus 121 shown in FIG. 6 is similar to the current sense apparatus shown in FIG. 3 except that resistor R0 is replaced by an adjustable resistor and capacitor C0 is replaced by an adjustable capacitor. By employing an adjustable resistor and an adjustable capacitor, the cutoff frequency of the filter is adjustable by adjusting one or both of the adjustable resistor and the adjustable capacitor.

Figure 7:
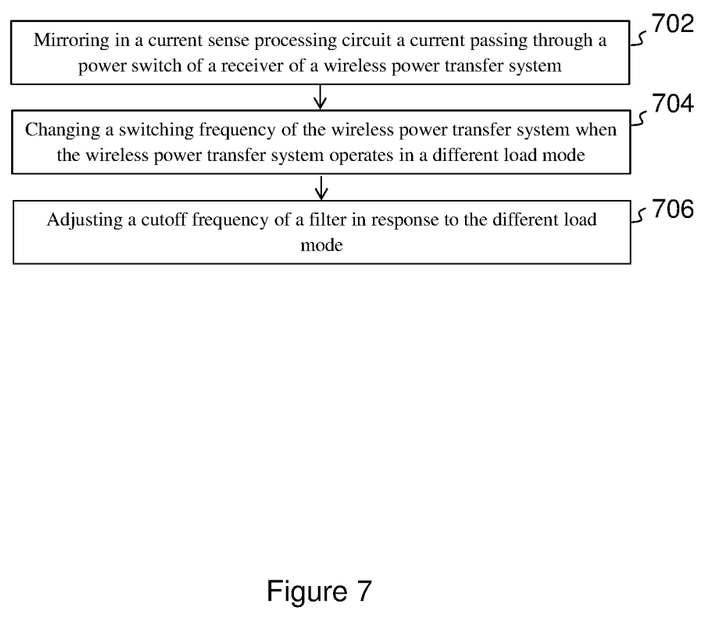
FIG. 7 illustrates a flow chart of a method for controlling the current sense apparatus shown in FIG. 2 in accordance with various embodiments of the present disclosure.

FIG. 7 illustrates a flow chart of a method for controlling the current sense apparatus shown in FIG. 2 in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

Referring back to FIG. 3, the current sense apparatus 121 has two inputs connected to a drain and a source of a power switch S1 respectively. In some embodiments, the current sense apparatus 121 comprises an amplifier, a sense switch and a filter. The sense switch is connected between the drain of the power switch and a non-inverting input of the amplifier.

The current sense apparatus 121 further comprises a current mirror formed by switches S3 and S4. A gate of switch S3 is connected to an output of the amplifier. A drain of the switch S3 is connected to the non-inverting input of the amplifier.

The current sense apparatus 121 further comprises a filter formed by R0 and C0. The filter is employed to attenuate the switching ripple generated by the rectifier 112, thereby achieving an accurate sensed current.

Under various operating conditions, the wireless power transfer system may operate in different switching frequencies. In order to better attenuate the switching ripple under different operation conditions, the filter may be of a variable cutoff frequency. In some embodiments, either the resistor R0 or the capacitor C0 is an adjustable element. In alternative embodiments, both the resistor R0 and the capacitor C0 are adjustable elements.

At step 702, when a load current flows from a drain of a power switch 113 to a source of the power switch 113, a current passing through the power switch is mirrored in a sense switch. A ratio of the load current flowing through the power switch to a sense current flowing through the sense switch is equal to a ratio of a drain-to-source on-resistance of the sense switch to a drain-to-source on-resistance of the power switch. The power switch 113 is part of a wireless power transfer system. The switching frequency of the wireless power transfer system is about 100 KHz. A filter is employed to attenuate the switching ripple of the wireless power transfer system. The filter is a low-pass filter having a predetermined cutoff frequency in a range from about 1 KHz to about 100 KHz. The filter comprises a resistor and a capacitor. At least one of the resistor and the capacitor is an adjustable element. For example, the resistor may comprise a plurality of resistor-switch networks connected in parallel.

At step 704, under a different load mode, the switching frequency of the wireless power transfer system may be changed to improve the efficiency of the wireless power transfer system.

At step 706, in order to better attenuate the switching ripple, the cutoff frequency of the filter is adjusted by controlling the plurality of resistor-switch networks connected in parallel. For example, the cutoff frequency may be reduced in response to the reduced switching frequency.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a power switch configured to conduct a current, wherein the current flows from a first drain/source terminal to a second drain/source terminal when the apparatus is configured as a transmitter in a wireless power transfer system, and the current flows from the second drain/source terminal to the first drain/source terminal when the apparatus is configured as a receiver in the wireless power transfer system;
a sense switch having a first drain/source terminal and a gate connected to the first drain/source terminal and a gate of the power switch respectively, wherein the sense switch is configured to sense a bidirectional current flowing through the power switch;
an amplifier having a first input coupled to the second drain/source terminal of the power switch and a second input coupled to a second drain/source terminal of the sense switch; and
a first current sense processing switch having a gate connected to an output of the amplifier.

2. The apparatus of claim 1, further comprising:
a filter coupled between the first input of the amplifier and the second drain/source terminal of the power switch.

3. The apparatus of claim 2, wherein the filter comprises a resistor and a capacitor, and wherein:
the resistor is connected between the first input of the amplifier and the second drain/source terminal of the power switch, wherein the resistor is connected to a high impedance node, and a current flowing through the resistor is approximately equal to zero; and
the capacitor is connected between the first input of the amplifier and the first drain/source terminal of the power switch.

4. The apparatus of claim 3, wherein:
the resistor is an adjustable resistor, and wherein the adjustable resistor is configured such that a cutoff frequency of the filter is adjustable based on an operating frequency of the wireless power transfer system and a frequency of a communication signal of the wireless power transfer system.

5. The apparatus of claim 3, wherein:
the capacitor is an adjustable capacitor, and wherein the adjustable capacitor is configured such that a cutoff frequency of the filter is adjustable based on an operating frequency of the wireless power transfer system and a frequency of a communication signal of the wireless power transfer system.

6. The apparatus of claim 3, wherein:
the resistor is an adjustable resistor; and
the capacitor is an adjustable capacitor, and wherein the adjustable resistor and the adjustable capacitor are configured such that a cutoff frequency of the filter is adjustable based on an operating frequency of the wireless power transfer system and a frequency of a communication signal of the wireless power transfer system.

7. The apparatus of claim 1, wherein:
the power switch is in a receiver and connected between a rectifier and a load.

8. The apparatus of claim 7, further comprising:
a filter coupled between the first input of the amplifier and the second drain/source terminal of the power switch, wherein the filter comprises a resistor and a capacitor, and wherein:
the resistor is connected between the first input of the amplifier and the second drain/source terminal of the power switch; and
the capacitor is connected between the first input of the amplifier and the first drain/source terminal of the power switch, and wherein:
the rectifier, the power switch, the sense switch, the amplifier and the first current sense processing switch are fabricated on a same semiconductor chip, and the capacitor is outside the same semiconductor chip.

9. The apparatus of claim 1, wherein:
the first input of the amplifier is an inverting input of the amplifier; and
the second input of the amplifier is a non-inverting input of the amplifier.

10. The apparatus of claim 1, further comprising:
a second current sense processing switch having a gate connected to the output of the amplifier, wherein:
the first current sense processing switch and the second current sense processing switch form a current mirror; and
the first current sense processing switch has a first drain/source terminal connected to the second input of the amplifier and a second drain/source terminal connected to ground.

11. A method comprising:
configuring a receiver to operate as a transmitter, wherein the receiver comprises a power switch configured to be fully turned on and a current flows from a first drain/source terminal to a second drain/source terminal of the power switch;
configuring the power switch to operate as a linear regulator when the receiver is configured to provide power fed into a load connected to the receiver; and
mirroring in a current sense processing circuit a bidirectional current passing through the power switch, wherein the current sense processing circuit comprises:
a sense switch having a first drain/source terminal and a gate connected to the first drain/source terminal and a gate of the power switch respectively; and
an amplifier having a first input coupled to the second drain/source terminal of the power switch and a second input coupled to a second drain/source terminal of the sense switch.

12. The method of claim 11, wherein:
the power switch is connected between a rectifier and the load, and wherein the rectifier is connected to a receiver coil, and wherein the receiver coil is configured to be magnetically coupled to a transmitter coil in a wireless power transfer system.

13. The method of claim 11, further comprising:
a filter coupled between the first input of the amplifier and the second drain/source terminal of the power switch.

14. The method of claim 13, wherein the filter comprises a resistor and a capacitor, and wherein:
- the resistor is connected between the first input of the amplifier and the second drain/source terminal of the power switch; and
- the capacitor is connected between the first input of the amplifier and the first drain/source terminal of the power switch.

15. The method of claim 14, further comprising:
- adjusting at least one of values of the capacitor and the resistor to adjust a cutoff frequency of the filter in response to a change of a frequency of a communication signal of a wireless power transfer system, wherein the cutoff frequency is greater than the frequency of the communication signal and less than an operating frequency of the wireless power transfer system.

16. A system comprising:
- a power switch coupled to a coil through a rectifier, wherein:
  - the power switch is configured to operate as a linear regulator when the coil provides power to a load connected to the power switch; and
  - the power switch is configured to operate as a fully turned-on switch when a current flowing from a power source connected to the power switch to the coil through the rectifier, and wherein the rectifier is configured to operate as a full-bridge converter; and
- a current sense apparatus having two inputs connected to a first drain/source terminal and a second drain/source terminal of the power switch respectively, wherein the current sense apparatus comprises:
  - a sense switch having a first drain/source terminal and a gate connected to the first drain/source terminal and a gate of the power switch respectively, wherein the sense switch is configured to sense a bidirectional current flowing through the power switch;
  - an amplifier having a first input coupled to the second drain/source terminal of the power switch and a second input coupled to a second drain/source terminal of the sense switch; and
  - a first current sense processing switch having a gate connected to an output of the amplifier.

17. The system of claim 16, further comprising:
- a filter coupled between the first input of the amplifier and the second drain/source terminal of the power switch, wherein the filter comprises a resistor and a capacitor, and wherein:
  - the resistor is connected between the first input of the amplifier and the second drain/source terminal of the power switch; and
  - the capacitor is connected between the first input of the amplifier and the first drain/source terminal of the power switch.

18. The system of claim 17, wherein:
- at least one of values of the capacitor and the resistor is adjustable, and wherein as a result of adjusting the at least one of values of the capacitor and the resistor, a cutoff frequency of the filter is adjusted.

* * * * *